United States Patent
Becker et al.

(10) Patent No.: US 10,760,771 B2
(45) Date of Patent: Sep. 1, 2020

(54) FOIL STRUCTURE WITH GENERATION OF VISIBLE LIGHT BY MEANS OF LED TECHNOLOGY

(71) Applicant: Schreiner Group GmbH & Co. KG, Oberschleissheim (DE)

(72) Inventors: Johannes Becker, Illmmuenster (DE); Sebastian Gepp, Dresden (DE); Manfred Hartmann, Petershausen (DE); Hartmut Wiederrecht, Eching (DE)

(73) Assignee: Schreiner Group GmbH & Co. KG, Oberschleissheim (DE)

( * ) Notice: Subject to any disclaimer, the term of this patent is extended or adjusted under 35 U.S.C. 154(b) by 0 days.

(21) Appl. No.: 16/010,669

(22) Filed: Jun. 18, 2018

(65) Prior Publication Data
US 2018/0363883 A1 Dec. 20, 2018

(30) Foreign Application Priority Data

Jun. 19, 2017 (DE) .................. 10 2017 113 375

(51) Int. Cl.
*F21V 9/32* (2018.01)
*F21K 9/64* (2016.01)
(Continued)

(52) U.S. Cl.
CPC .................. *F21V 9/32* (2018.02); *F21K 9/64* (2016.08); *F21V 9/30* (2018.02); *F21V 9/38* (2018.02);
(Continued)

(58) Field of Classification Search
CPC ........... F21V 9/32; F21K 9/64; F21Y 2115/10
See application file for complete search history.

(56) References Cited

U.S. PATENT DOCUMENTS 6,160,273 A 12/2000 Fork et al.
7,988,336 B1* 8/2011 Harbers .................... F21K 9/00
362/294
(Continued)

FOREIGN PATENT DOCUMENTS

| CN | 101828271 A | 9/2010 |
|----|-------------|--------|
| CN | 103563108 A | 2/2014 |

(Continued)

OTHER PUBLICATIONS

First Office Action in Chinese Patent Application No. 201810630752.4 dated May 20, 2020.
(Continued)

*Primary Examiner* — Donald L Raleigh
(74) *Attorney, Agent, or Firm* — Collard & Roe, P.C.

(57) ABSTRACT

A foil structure with generation of visible light using LED technology includes a carrier foil and an LED chip for generation of UV light. The LED chip is disposed on the carrier foil and is provided with a light output face for emission of the UV light. Furthermore, the foil structure includes a color reaction layer for conversion of the UV light into the visible light. The color reaction layer is disposed above the LED chip or in a manner laterally offset relative to the LED chip. The color reaction layer is provided with a structuring, so that the UV light emitted from the light output face of the LED chip is not emitted into the surroundings of the foil structure.

20 Claims, 11 Drawing Sheets

(51) Int. Cl.
*H05K 1/18* (2006.01)
*H01L 33/50* (2010.01)
*F21V 9/30* (2018.01)
*F21V 9/38* (2018.01)
F21Y 115/10 (2016.01)
H05K 1/02 (2006.01)
F21Y 107/70 (2016.01)
F21V 8/00 (2006.01)

(52) U.S. Cl.
CPC ........... *H01L 33/507* (2013.01); *H05K 1/189* (2013.01); *F21Y 2107/70* (2016.08); *F21Y 2115/10* (2016.08); *G02B 6/005* (2013.01); *G02B 6/0088* (2013.01); *H01L 2933/0091* (2013.01); *H05K 1/0274* (2013.01); *H05K 2201/0108* (2013.01); *H05K 2201/055* (2013.01); *H05K 2201/10106* (2013.01)

(56) References Cited

U.S. PATENT DOCUMENTS

| | | | |
|---|---|---|---|
| 8,084,934 | B2 | 12/2011 | Kim et al. |
| 8,362,512 | B2 | 1/2013 | Hussell et al. |
| 8,795,817 | B2 | 8/2014 | Kwak et al. |
| 9,272,370 | B2 | 3/2016 | Finn et al. |
| 9,543,479 | B2 | 1/2017 | Herrmann |
| 9,618,179 | B2 | 4/2017 | Michiels et al. |
| 9,722,146 | B2 | 8/2017 | Kwak et al. |
| 9,902,315 | B2 | 2/2018 | Salter et al. |
| 9,991,431 | B2 | 6/2018 | Lacey et al. |
| 2002/0088987 | A1 | 7/2002 | Sakurai |
| 2005/0085010 | A1 | 4/2005 | Tsunoda et al. |
| 2005/0230853 | A1 | 10/2005 | Yoshikawa |
| 2006/0029819 | A1* | 2/2006 | Cho ............ H05K 3/388 428/458 |
| 2006/0034084 | A1* | 2/2006 | Matsuura ......... H01L 33/507 362/293 |
| 2007/0024173 | A1 | 2/2007 | Braune |
| 2008/0043194 | A1 | 2/2008 | Lin et al. |
| 2008/0074901 | A1 | 3/2008 | David et al. |
| 2008/0142816 | A1* | 6/2008 | Bierhuizen .......... F21K 9/00 257/82 |
| 2009/0101930 | A1* | 4/2009 | Li ............... G02B 6/005 257/98 |
| 2010/0084665 | A1 | 4/2010 | Daniels et al. |
| 2011/0148279 | A1 | 6/2011 | Li et al. |
| 2011/0294240 | A1 | 12/2011 | Kim |
| 2012/0140436 | A1* | 6/2012 | Yang ............... F21V 13/02 362/84 |
| 2012/0162945 | A1 | 6/2012 | Schreiner |
| 2012/0199005 | A1* | 8/2012 | Koji ............... A61L 9/205 96/224 |
| 2012/0261680 | A1 | 10/2012 | Demuynck |
| 2013/0033888 | A1* | 2/2013 | Van Der Wel ......... F21V 3/06 362/555 |
| 2013/0234187 | A1 | 9/2013 | Ebe et al. |
| 2013/0250546 | A1* | 9/2013 | Hu .............. F21V 9/40 362/84 |
| 2013/0334559 | A1 | 12/2013 | Vdovin et al. |
| 2014/0072812 | A1* | 3/2014 | Hamada ......... H01S 5/02296 428/432 |
| 2014/0231834 | A1 | 8/2014 | Lowenthal et al. |
| 2014/0233212 | A1* | 8/2014 | Park ............ G02F 1/133606 362/84 |
| 2014/0376223 | A1 | 12/2014 | Bergenek |
| 2015/0043243 | A1 | 2/2015 | Gourlay |
| 2015/0102722 | A1* | 4/2015 | Ohbayashi ............ F21S 41/14 313/498 |
| 2015/0132873 | A1 | 5/2015 | Rogers et al. |
| 2016/0268488 | A1* | 9/2016 | Goeoetz ............ C09K 11/7774 |
| 2016/0298822 | A1* | 10/2016 | Michiels .............. F21V 5/005 |
| 2016/0315236 | A1 | 10/2016 | Makkonen et al. |
| 2016/0341396 | A1* | 11/2016 | Lee ............ F21V 7/0025 |
| 2017/0160457 | A1* | 6/2017 | Roh ............ H01J 11/44 |
| 2017/0311422 | A1* | 10/2017 | Arai ............ H04R 1/028 |
| 2018/0197912 | A1 | 7/2018 | Sweegers et al. |

FOREIGN PATENT DOCUMENTS

| | | | | |
|---|---|---|---|---|
| CN | 102859271 A | | 1/2016 | |
| CN | 105980768 A | | 9/2016 | |
| CN | 108139034 A | | 6/2018 | |
| DE | 103 06 870 A1 | | 9/2004 | |
| DE | 10 2007 039 416 A1 | | 2/2009 | |
| DE | 10 2009 020 540 B4 | | 6/2012 | |
| DE | 10 2012 102 804 B3 | | 2/2013 | |
| DE | 11 2011 102 800 T5 | | 6/2013 | |
| DE | 10 2012 101 463 A1 | | 8/2013 | |
| DE | 10 2012 202 927 A1 | | 8/2013 | |
| DE | 10 2014 104 230 A1 | | 10/2015 | |
| DE | 10 2014 110 067 A1 | | 1/2016 | |
| DE | 20 2017 102 154 U1 | | 5/2017 | |
| EP | 2 469 991 A2 | | 6/2012 | |
| EP | 1 611 619 B1 | | 1/2013 | |
| EP | 2 779 806 A2 | | 9/2014 | |
| JP | 2003-092020 A | | 3/2003 | |
| KR | 20130022595 A | * | 3/2013 | ......... H01L 33/0004 |
| TW | 201312216 A | | 3/2013 | |
| WO | WO-2005100016 A2 | * | 10/2005 | ............... B32B 3/28 |
| WO | 2013/105007 A1 | | 7/2013 | |
| WO | WO 2015058983 A1 | * | 4/2015 | ............. F21V 5/002 |

OTHER PUBLICATIONS

Chinese Office Action in Chinese Application No. 201810613335.9, dated Jun. 19, 2020 with English translation.

* cited by examiner

FOIL STRUCTURE WITH GENERATION OF VISIBLE LIGHT BY MEANS OF LED TECHNOLOGY

CROSS-REFERENCE TO RELATED APPLICATIONS

This application claims priority under 35 USC 119 of German Patent Application No. DE 10 2017 113 375.5 filed on Jun. 19, 2017, the disclosure of which is herein incorporated by reference.

BACKGROUND OF THE INVENTION

1. Field of the Invention

The invention relates to a foil structure with generation of visible light by means of light-emitting diode (LED) technology, wherein the light is generated by a light-emitting diode.

2. Description of the Related Art

Because of their small installation space and their small footprint, light-emitting diodes are used in many areas of application for illumination of articles or for backlighting of operators' panels. An LED module usually comprises an LED chip with a light output face. The LED chip is contained in a housing, for example a plastic housing. Many LED chips emit light in the ultra-violet (UV) or near-UV region. The conversion of the UV light into visible light takes place by a reaction layer, which converts the UV light incident upon it into visible light. The reaction layer is introduced into the housing of the LED module.

LEDs with plastic housings are usually disposed and built into a rigid board, for example a printed circuit board (PCB). Depending on application, electronic circuits are often disposed on flexible substrates, for example on a carrier foil. Certainly an LED module with plastic housing may be disposed on a foil substrate. Placement of the LED module usually is not carried out mechanically, however, because chip-insertion systems for insertion of flexible substrates usually cannot process LED modules with plastic housings. In many cases, an LED module with plastic housing can be fastened only manually on the foil substrate. The insertion process is therefore laborious. Furthermore, the light yield or light color of the light emitted by an LED module with plastic housing can be changed or modified only with difficulty.

SUMMARY OF THE INVENTION

One concern of the present invention is to specify a foil structure with generation of visible light by means of LED technology, wherein the foil structure can be manufactured with little fabrication effort and the optical properties of the LED can be modified in simple manner.

Such a foil structure with generation of visible light by means of LED technology is provided according to the embodiments of the invention.

The foil structure comprises a carrier foil and an LED chip for generation of UV light. In the following, UV light means light in the wavelength region between 1 nm and 480 nm. The LED chip is disposed on the carrier foil and is provided with a light output face for emission of the UV light. Furthermore, the foil structure comprises a color reaction layer for conversion of the UV light into the visible light.

The color reaction layer is above the LED chip or in a manner laterally offset relative to the LED chip. The color reaction layer is provided with a structuring, so that the UV light emitted from the light output face of the LED chip is not emitted into the surroundings of the foil structure.

The LED chip is provided only with the light output face for emergence of the UV light, but is not disposed in a plastic housing. Thus it is a wafer-based chip, which has been separated from a wafer. By the use of such an LED chip, the foil structure containing the LED chip can be fabricated in automated manner by roll-to-roll rotary manufacturing.

The chip and also the color reaction layer may be disposed on different portions of the carrier foil. The carrier foil may be folded over in such a way that the portion of the carrier foil containing the color reaction layer is disposed above a light output face of the chip or in a manner laterally offset relative to the light output face of the chip. Further electrical and non-electrical elements in the flat state may be produced and then transferred into another plane by the folding. For example, a touch-sensitive area and a light source behind it may be disposed closer to the user.

New mixed colors may be produced by further measures, such as, for example, by combination of various phosphor inks. In addition, the possibility exists of combining the phosphor inks with other inks, for example with daylight inks or opaque inks, in order in turn to achieve new effects.

It is possible to create different color transitions by printing phosphor inks one above the other or by means of lines alongside one another or as grids.

In order to influence and if possible to homogenize the light scattering and light intensity, it is likewise possible to apply various printing methods, in which different layers are printed one above the other or alongside one another. For example, phosphor inks may be overprinted in various opacities in grid printing as a color reaction layer on the carrier foil. The opacity is adjusted by the grain size, by its distribution in the ink and by the printed layer thickness. A minimum layer thickness or number of particles is required in order for the effect to work properly.

Furthermore, "mechanical" options are available for light guiding or light scattering. For example, foils as spacers with different optical effects may be inserted between the light output face of the LED chip and the color reaction layer.

BRIEF DESCRIPTION OF THE DRAWINGS

Other objects and features of the invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views.

DETAILED DESCRIPTION OF PREFERRED EMBODIMENTS

Figure 1:
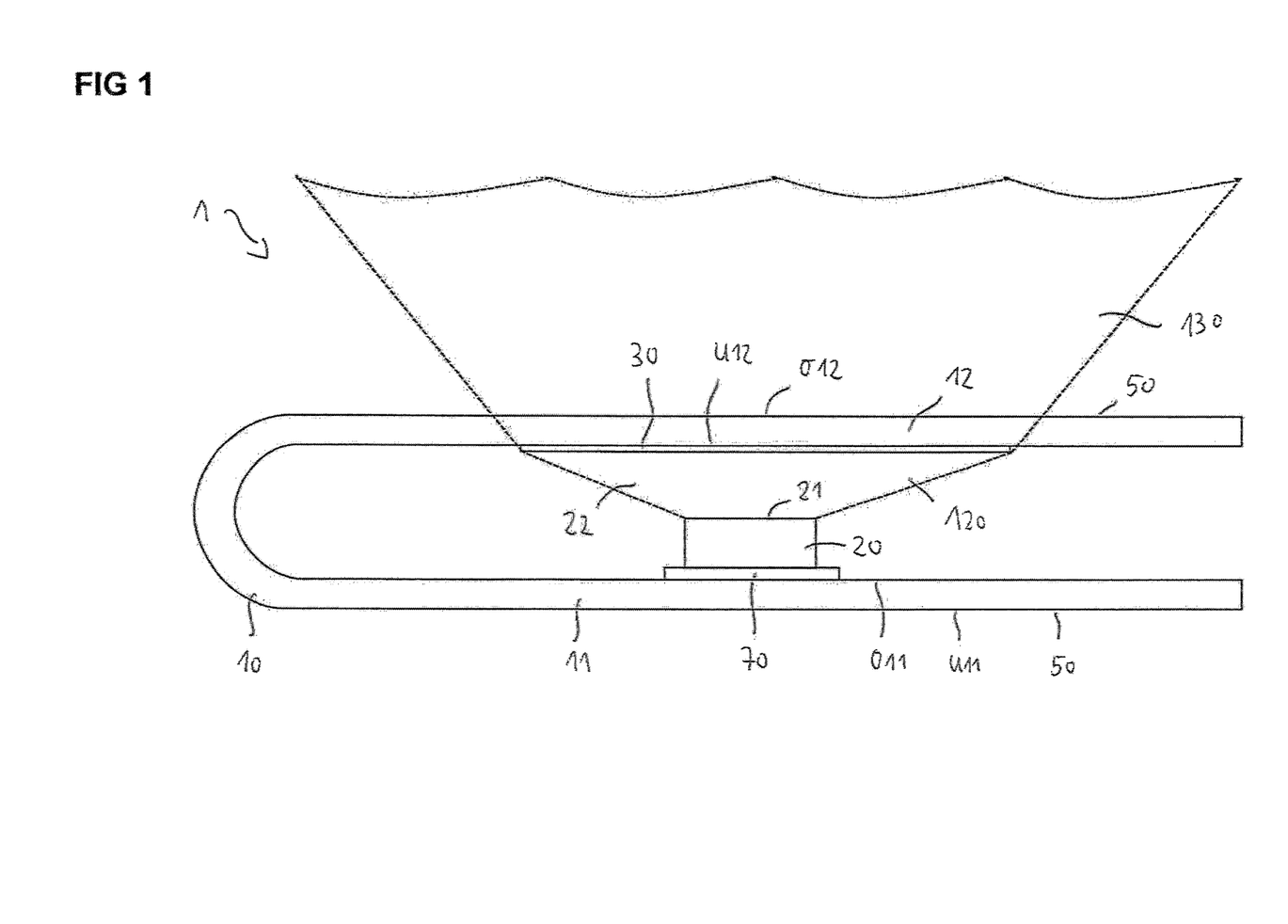
FIG. 1 shows an embodiment of a foil structure with generation of visible light by means of LED technology with a folded-over carrier foil.

FIG. 1 shows an embodiment of a foil structure 1 with a carrier foil 10, on which an LED chip 20 for generation of UV light is disposed. The LED chip 20 is provided with the light output face 21 for emission of the UV light. The chip exists in wafer form. Thus, in contrast to a conventional LED, the chip is not contained in a plastic housing. Instead, the LED chip 20 comprises only the part of the silicon wafer with the light output face, from which the UV light is emitted, as well as a contact pad, which may be disposed on the upper side or underside of the LED chip. An adhesive layer 50 may be disposed on carrier foil 10.

For conversion of the UV light emitted by the LED chip 20 into visible light, the foil structure 1 is provided with a color reaction layer 30. The color reaction layer is disposed on the carrier foil 10. In the embodiment illustrated in FIG. 1, the carrier foil 10 is folded over in such a way that the color reaction layer 30 is disposed above the LED chip 20 or above a light output region 22 of the light output face 21 of the LED chip 20. At least partial regions of the color reaction layer 30 are disposed in perpendicular projection above the light output face 21 of the LED chip.

The LED chip 20 is disposed on a portion 11 of the carrier foil 10. The color reaction layer 30 is disposed on a portion 12 of the carrier foil 10. The LED chip 20 is disposed on an upper side O11 of the portion 11 of the carrier foil 10. The color reaction layer 30 is disposed on an underside U12 of the portion 12 of the carrier foil 10 that faces the upper side O11 of the portion 11 of the carrier foil 10. The embodiment of the foil structure 1 shown in FIG. 1 may also be modified such that the color reaction layer 30 is disposed on an upper side O12 of the portion 12 of the carrier foil 10 that faces away from the light output face 21 of the LED chip 20. The carrier foil 10 is folded over in such a way that the portion 12 of the carrier foil 10 is disposed above the portion 11 of the carrier foil 10.

In the embodiment of the foil structure 1 shown in FIG. 1, the light output face 21 of the LED chip 20 is disposed parallel to the face of the portion 12 of the carrier foil 10 on which the color reaction layer 30 is also disposed. The UV light 120, not visible to the human eye, emitted by the LED chip 20 from the light output face 21 is incident on the color reaction layer 30 and is converted by the color reaction layer 30 into visible light 130. The visible light 130 passes through the portion 12 of the carrier foil 10 and is emitted into the surroundings. At least the portion 12 of the carrier foil 10 is designed to be translucent.

Figure 2:
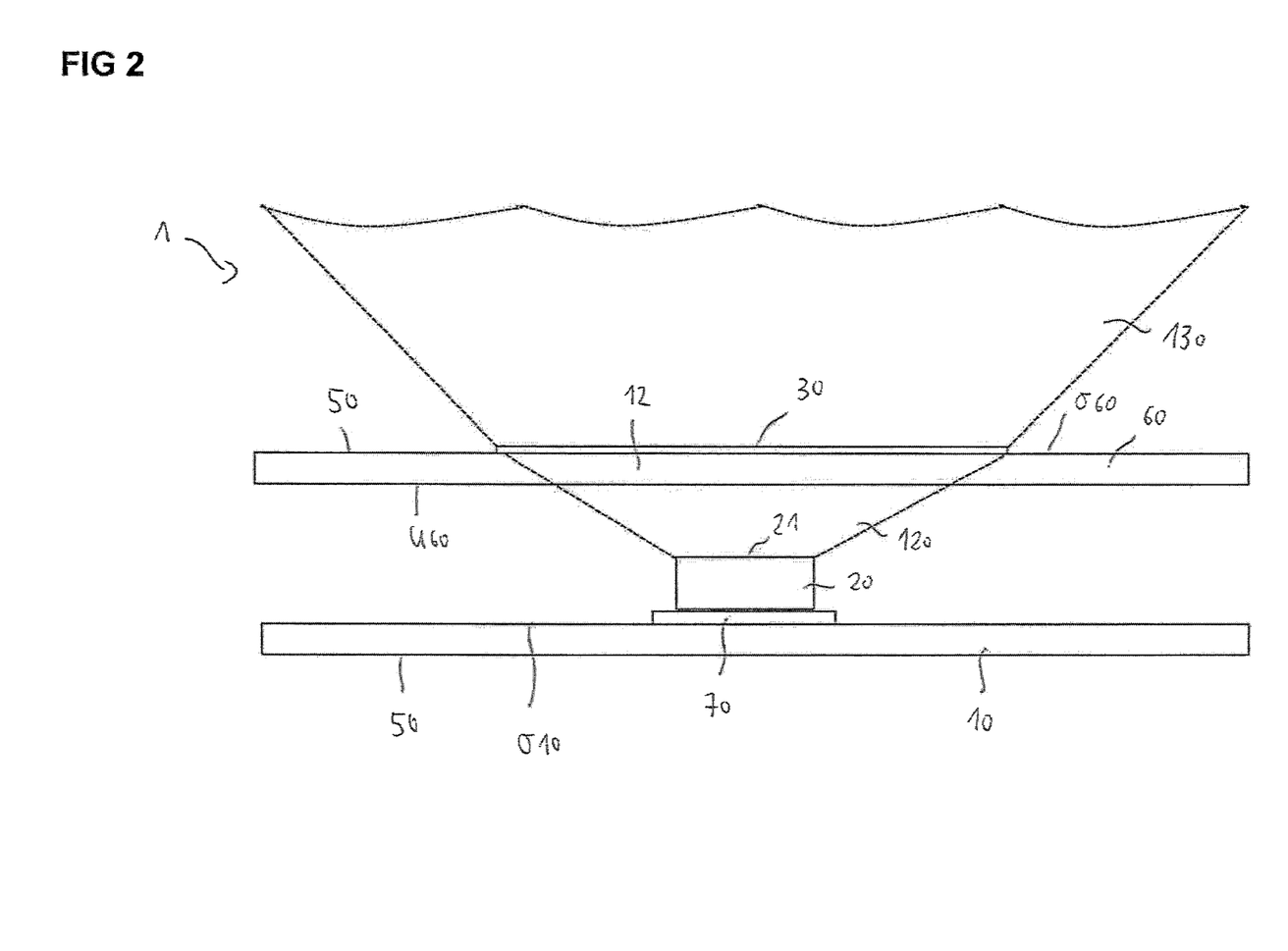
FIG. 2 shows a further embodiment of a foil structure with generation of visible light by means of LED technology with a separate carrier/cover foil for application of a color reaction layer.

FIG. 2 shows a further embodiment of a foil structure 1 for generation of visible light by means of an LED technology. The foil structure comprises the carrier foil 10 as well as the LED chip 20 for generation of UV light with a light output face 21 for emission of the UV light 120. The LED chip 20 is disposed on an upper side O10 of the carrier foil 10 and emits UV light 120 upward from the light output face 21. The color reaction layer 30 is provided for conversion of the UV light 120 into the visible light 130.

In contrast to the embodiment shown in FIG. 1, the color reaction layer 30 is disposed on a separate carrier or cover foil 60. As in the embodiment shown in FIG. 1, the color reaction layer 30 may be disposed on an underside U60 of the separate carrier foil 60. FIG. 2 shows an embodiment in which the color reaction layer 30 is disposed on an upper side O60 of the separate carrier foil 60. The upper side O60 of the carrier foil 60 is that surface of the carrier foil 60 that faces away from the light output face 21 of the LED chip 20.

Figure 3:
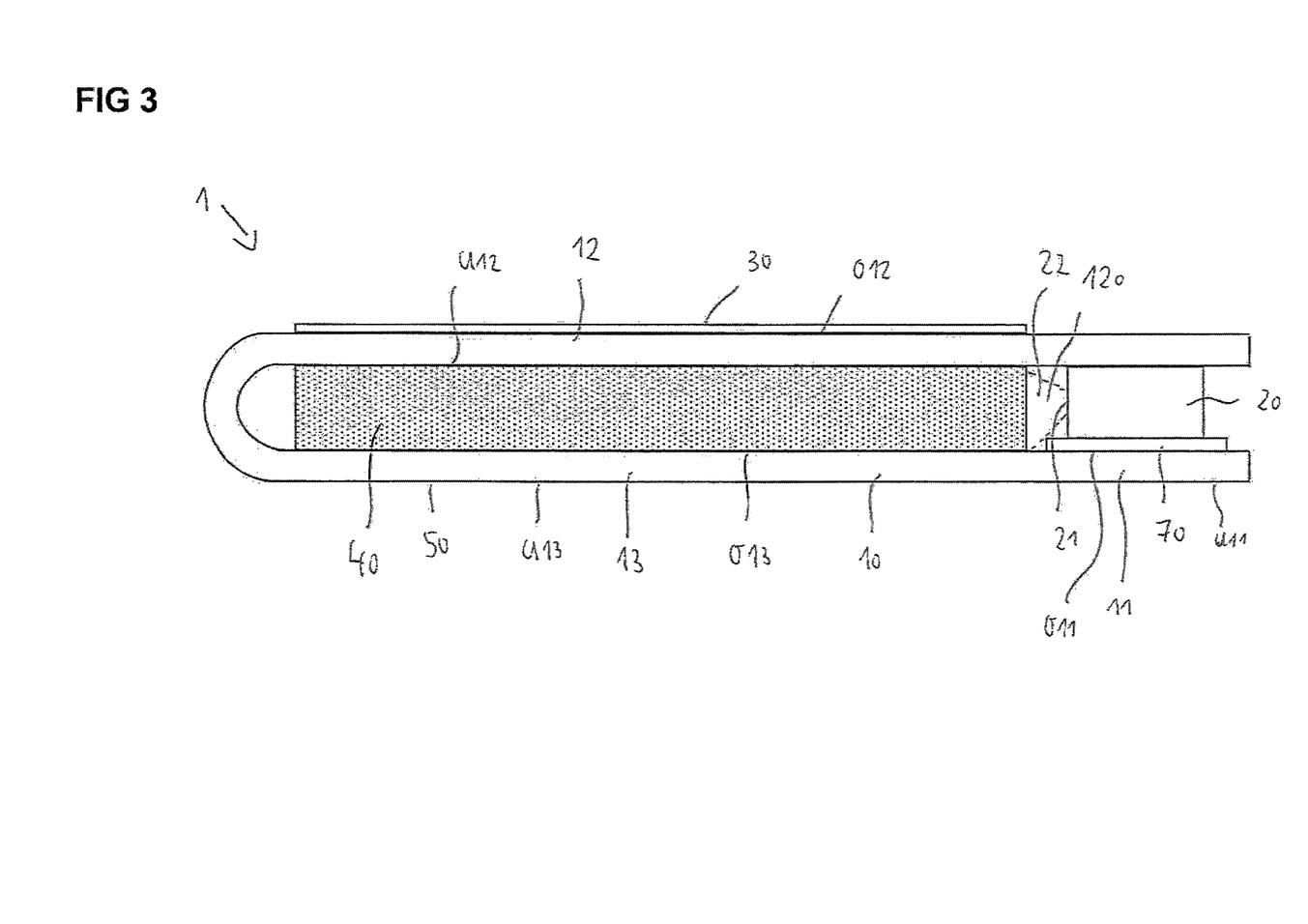
FIG. 3 shows a further embodiment of a foil structure with generation of visible light by means of LED technology with a folded-over carrier foil and an LED chip as an edge emitter.

FIG. 3 shows a further embodiment of the foil structure 1 with a carrier foil 10, on which an LED chip 20 for generation of UV light is disposed. The LED chip 20 is disposed on the upper side O11 of the portion 11 of the carrier foil 10. The LED chip 20 is provided with the light output face 21 for emission of the UV light. Furthermore, the foil structure 1 comprises the color reaction layer 30 for conversion of the UV light into the visible light. In the embodiment illustrated in FIG. 3, the color reaction layer 30 is disposed on the portion 12 of the carrier foil 10 that faces away from the upper side O11 of the portion 11 of the carrier foil 10. As illustrated in FIG. 3, the color reaction layer 30 may be disposed on the upper side O12 of the portion 12 of the carrier foil 10 and also on the underside U12 of the portion 12 of the carrier foil 10 that faces the upper side O11 of the portion 11 of the carrier foil 10.

In contrast to the embodiment shown in FIG. 1, the carrier foil 10 is folded over in such a way that the color reaction layer 30 is disposed in a manner laterally offset relative to the LED chip 20 or laterally offset relative to the light output region 22 of the light output face 21 of the LED chip 20. The carrier foil 10 is folded over in such a way that the portion 12 of the carrier foil 10 is disposed in a manner laterally offset relative to the portion 11 of the carrier foil. The LED chip 20 is formed as an edge emitter. The light output face 21 of this LED chip 20 is disposed perpendicular to the face of the portion 12 of the carrier foil 10 on which the color reaction layer 30 is also provided.

A portion 13 of the carrier foil is disposed between the portion 11 and the portion 12 of the carrier foil. The foil structure according to FIG. 3 comprises a spacing layer 40. The spacing layer 40 is disposed between the portion 12 and the portion 13 of the carrier foil 10. In the embodiment of the foil structure 1 shown in FIG. 3, the LED chip 20 is formed as an edge emitter and emits UV light 120 laterally from the light output face 21 into the spacing layer 40. The spacing layer 40 may be formed as a light-guide foil, in which the light is deflected or scattered in the direction of the color reaction layer 30. The UV light is converted into visible light in the color reaction layer 30 and emitted into the surroundings.

Figure 4:
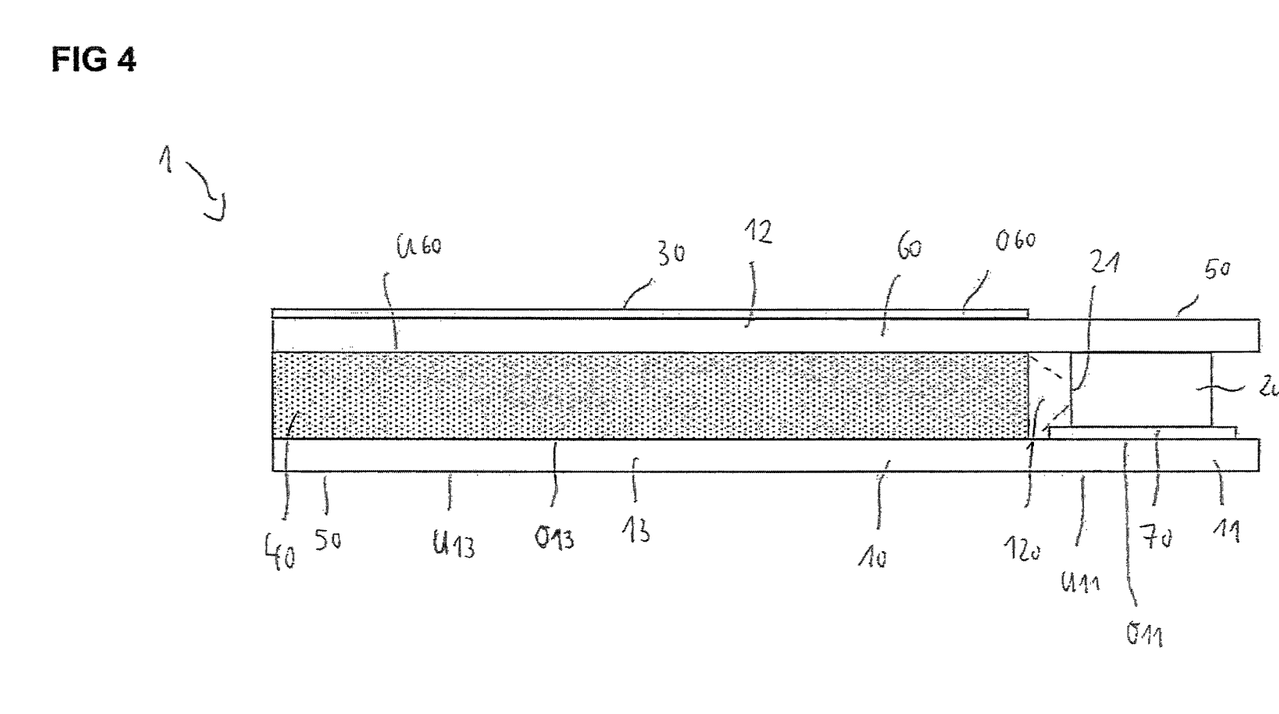
FIG. 4 shows a further embodiment of a foil structure with generation of visible light by means of LED technology with a separate carrier/cover foil and an LED chip as an edge emitter.

FIG. 4 shows an embodiment of the foil structure 1 with a carrier foil 10, on which an LED chip 20 is disposed. A separate carrier or cover layer 60 is disposed above the LED chip 20. The foil structure is provided with the color reaction layer 30 for conversion of the UV light emitted from the light output face 21 of the LED chip into visible light. The color reaction layer 30 is disposed on the separate carrier/cover foil 60. The color reaction layer 30 may be disposed on an underside U60 or an upper side O60 of the carrier/cover foil 60.

In particular, the color reaction layer 30 carrier foil 10 is disposed in a manner laterally offset relative to the LED chip 20 or laterally offset relative to the light output face 21 of the LED chip 20. The spacing layer 40 is provided between the portion of the carrier/cover foil 60 that is disposed in a manner laterally offset relative to the LED chip 20 and the portion of the carrier foil 10 that is disposed in a manner laterally offset relative to the LED chip 20. As in the embodiment shown in FIG. 3, the LED chip 20 is formed as an edge emitter. The light output face 21 of the LED chip 20 is disposed parallel to the normal to the carrier/cover foil 60 or parallel to the normal to the carrier foil 10. The LED chip 20 emits UV light laterally from the light output face 21 into the spacing layer 40. As in the embodiment shown in FIG. 3, the spacing layer 40 may be formed as a light-guide foil, which deflects or scatters the UV light in the direction of the color reaction layer 30.

It must be pointed out that the color reaction layer 30 in the embodiments of the foil structure shown in FIGS. 3 and 4 may be disposed, instead of on the portion 12 of the carrier foil 10 or on the carrier/cover foil 60, also on an upper side O13 or underside U13 of the region 13 of the carrier foil 10. In this case, the spacing layer 40 is formed in such a way that it deflects or scatters the incident UV light in the direction of the portion 13 of the carrier foil 10.

The LED chip 20 may be operated with direct and low-voltage current. Thereby it is not necessary to use any complex voltage conversion or energy source. In the embodiment of the foil structure 1 shown in FIGS. 1 to 4, an electrical conductor track may be applied on the carrier foil 10 for the supply of a voltage to the LED chip 20. All suitable printing methods, for example, screen, flexographic, intaglio, inkjet or pad printing, may be used for this purpose.

The LED chip 20 is preferably formed with a contact pad on the side situated opposite the light output face 21. By means of a transparent anisotropic conductive adhesive, it is also possible to use a conventional LED chip with contact pads on the luminous side. In this embodiment, the LED chip 20 may be glued onto the carrier foil by means of the transparent, anisotropic conductive adhesive. In the embodiments of the foil structure illustrated in FIGS. 1 to 4, an anisotropic conductive adhesive 70 is applied on the back side of the LED chip 20, in order to glue the LED chip 20 onto the carrier foil 10.

The color reaction layer 30 contained in FIGS. 1 to 4 may contain phosphor for conversion of the UV light or of the light in the near-UV region. By combination of phosphor layers with various emission wavelengths, meaning by combination of various phosphor inks, new mixed colors can be formed in the color reaction layer 30. In addition, the possibility exists of combining the phosphor inks with other inks, for example with daylight inks or opaque inks, in order in turn to achieve new effects. Thus mixed colors can be regulated in different manners and ways.

The following FIGS. 5 to 10 show a partial view of the foil structure 1. What is illustrated is only a partial view of the folded foil structure 1 of FIGS. 1 and 3, in which the color reaction layer 30 is disposed on the upper side O12 of the portion 12 of the carrier foil 10. The embodiments of the foil structure shown in FIGS. 5 to 10 are also applicable, however, to the embodiments of the foil structure containing the separate carrier/cover foil 60 shown in FIGS. 2 and 4. In these cases, the color reaction layer 30 shown in FIGS. 5 to 10 is disposed on the carrier/cover foil 60. Although FIGS. 5 to 10 show the color reaction layer 30 on the upper side O12 of the portion 12 of the carrier foil 10, the color reaction layer in the embodiments of the foil structure described in the following on the basis of FIGS. 5 to 10 may also be disposed on the underside U12 of the portion 12 of the carrier foil 10 or on the underside U60 of the carrier/cover foil 60. Likewise, the color reaction layer 30 for the embodiments of FIGS. 5 to 10 described in the following may also be disposed on the upper side or underside of the portion 13 of the carrier foil 10.

Figure 5:
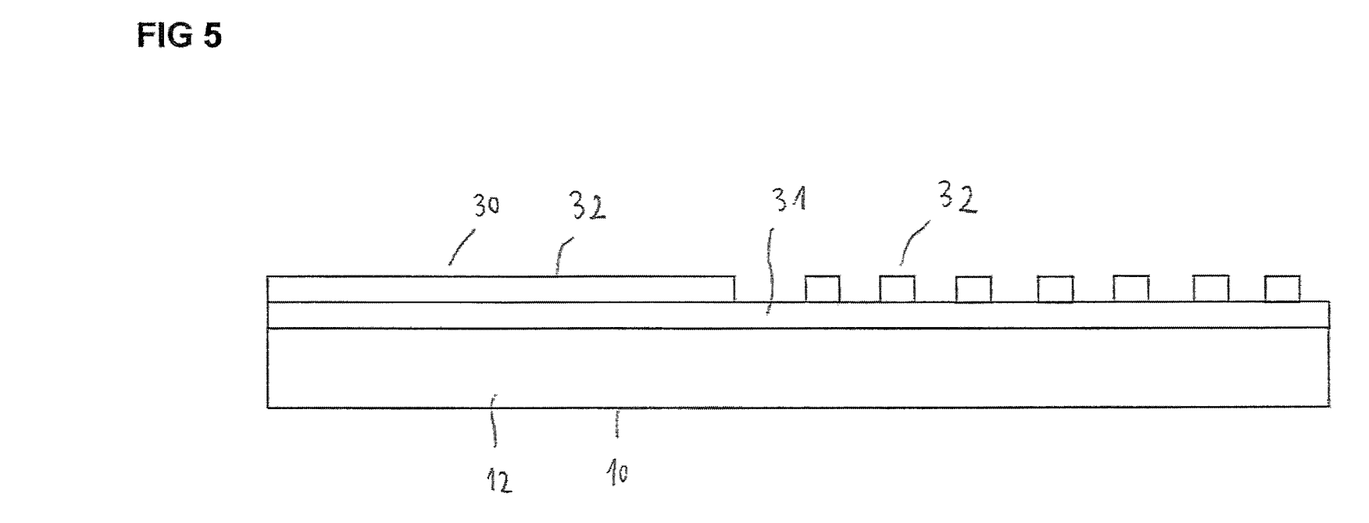
FIG. 5 shows an embodiment of a color reaction layer with two different courses for generation of color transitions and mixed colors.
Figure 6A:
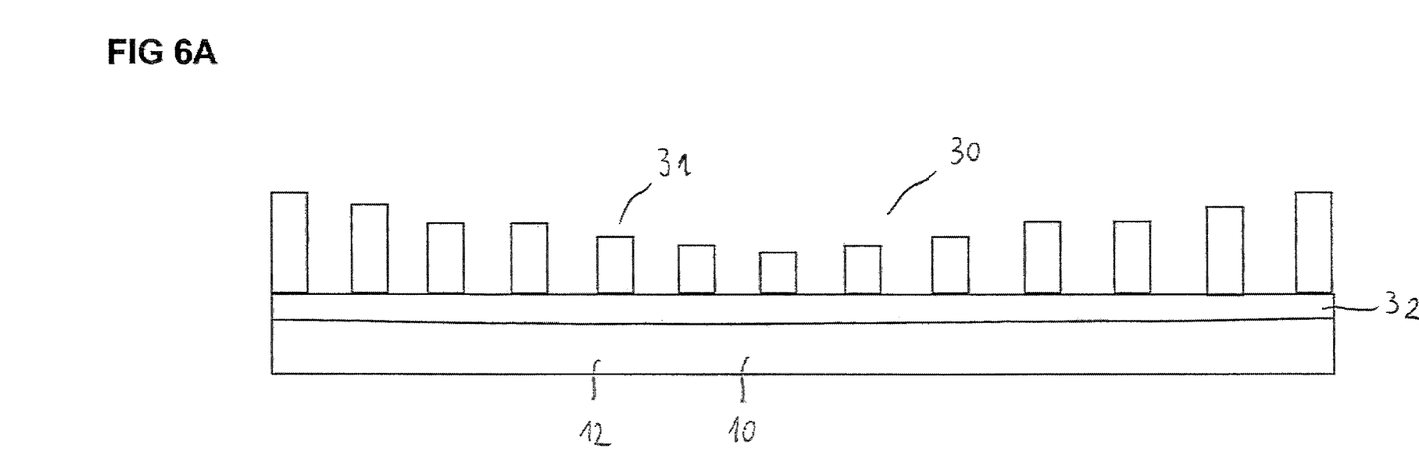
FIG. 6A shows a configuration of a color reaction layer as a dot and/or line grid with modulation of the height of the dots and/or of the lines of the grid.
Figure 6B:
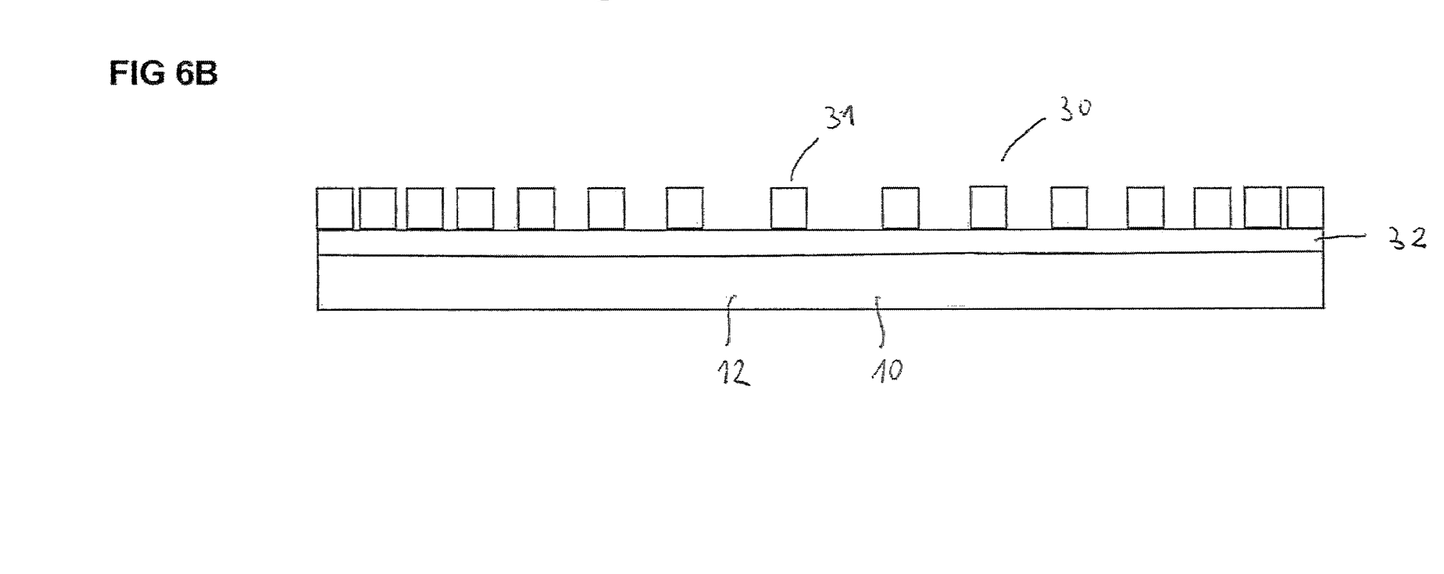
FIG. 6B shows a configuration of a color reaction layer as a dot and/or line grid with modulation of the spacings between the dots and/or lines of the grid.

FIGS. 5, 6A and 6B show a multiple-layer, especially a two-layer structure of the color reaction layer 30. The color reaction layer 30 is provided with an upper course 32, which is disposed on a lower course 31 of the color reaction layer. In principle, the color reaction layer 30 may also be provided with even further courses. In the exemplary embodiments illustrated in FIGS. 5, 6A and 6B, the course 31 of the color reaction layer 30 overprinted in full-surface manner on the carrier foil 10 prevents light in the UV or near-UV region from being emitted into the surroundings of the foil structure. In the multiple-layer foil structure, the lower course 31 of the color reaction layer 30 on which the UV light emitted by the LED chip is first incident may have a shorter emission wavelength than the upper course 32 of the color reaction layer. The courses 31 and 32 of the color reaction layer 30 are formed as phosphor layers.

FIG. 5 shows a partial view of an embodiment of the foil structure 1 with the color reaction layer 30, which is disposed on the portion 12 of the carrier foil 10. The color reaction layer 30 comprises at least one course 32, which is formed completely or, as shown in FIG. 5, at least portionwise as a dot and/or line grid of dots and/or lines of the color reaction layer 30. The course 32, however, may also be disposed in full-surface manner or, as shown in FIG. 5, in portion-wise full-surface manner on the course 31 of the color reaction layer 30.

By the overprinting or phosphor inks one above the other, it is possible to create different color transitions. Furthermore, the possibility exists, by the printing of courses of phosphor with different emission wavelengths in the form of lines alongside one another or as grids, to create different color transitions. The courses of the color reaction layer may also be printed in other geometric shapes, for example in the form of diamonds or concentric circles. The course 32 of the color reaction layer 30 has an emission wavelength that is longer than the emission wavelength of the course 31 of the color reaction layer 30. For example, the at least one further course 31 of the color reaction layer 30 may have an emission wavelength of 515 nm and the at least one course 32 of the color reaction layer 30 an emission wavelength of 630 nm.

The generation of a mixed color will be explained in the following on the basis of an exemplary embodiment. During use of a course 31 of phosphor with an emission wavelength of 515 nm, the incident UV light will be converted into green light. On those regions of the color reaction layer 30 on which grid dots or grid lines of the course 32 of the color reaction layer 30 are disposed above the course 31, the green light beamed into the course 32 will be converted by the course 32 of the color reaction layer 30 into red light. Due to the combination of the emitted green and red light, an observer therefore has the impression of an area lighting up yellow.

The phosphors are available in a graduation of 5 nm and accordingly are able to generate almost any arbitrary color. By skillful printing one upon the other, therefore, it is possible to generate many different colors with only a few basic colors, and complexity of production can be reduced.

FIGS. 6A and 6B show an embodiment of the color reaction layer 30 with a course 31 of the color reaction layer 30 overprinted in full-surface manner on the carrier foil 10 and a course 32 of the color reaction layer that is disposed above it and is provided with a dot or line grid. In the embodiment shown in FIG. 6A, the height of the dots and/or lines of the course 32 is varied. In the embodiment shown in FIG. 6B, the spacing of the dots and/or lines of the course 32 of the color reaction layer 30 is varied. The dot and/or line grid of the color reaction layer layer 30 is amplitude-modified in the embodiment shown in FIG. 6A and frequency-modulated in the embodiment shown in FIG. 6B. Thereby the impression arises for an observer that the color reaction layer contains different color transitions during irradiation with UV light.

In the embodiment of the color reaction layer 30 shown in FIG. 6A, the height of the grid dots/grid lines, starting from a position at the center above the light output face 21 of the LED chip, increases toward both rims of the color reaction layer 30. In the embodiment shown in FIG. 6B, the grid is frequency-modulated, because the grid dots/grid lines of the course 32 of the color reaction layer 30 have, at the center above the light output face 21 of the LED chip 20, a large spacing, which decreases toward both rims of the color reaction layer 30. Thereby a homogeneous light impression of the emitted light arises for an observer.

A further possibility for generation of color transitions consists in changing the thickness of the ink application with which the color reaction layer 30 is applied on the carrier foil 30 or on the carrier/cover foil 60. The ink thickness may be changed, for example, by the number of printing passes or by selection of the print shape.

Figure 7:
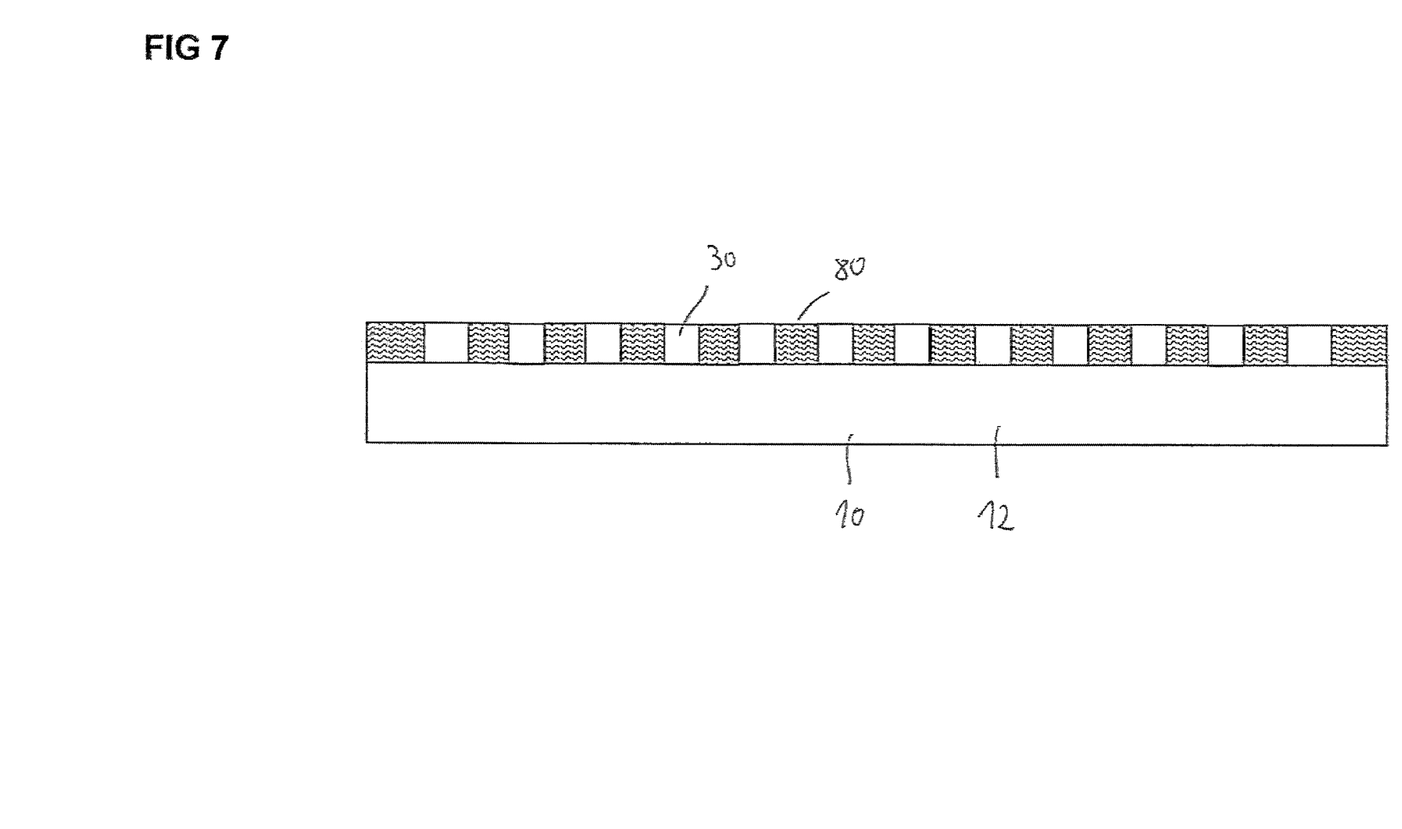
FIG. 7 shows a configuration of a color reaction layer as a dot and/or line grid with an imprinted opaque ink.

Furthermore, the possibility exists of printing the phosphor ink of the color reaction layer 30 and an opaque ink together in the grid printing. FIG. 7 shows an embodiment of the foil structure in which the color reaction layer 30 is configured as a dot and/or line grid. The grid may contain various phosphor inks. To prevent light from the UV or near-UV region from being emitted into the surroundings, an opaque ink 80 is imprinted between the dots and/or lines of the grid of the color reaction layer 30.

Figure 8:
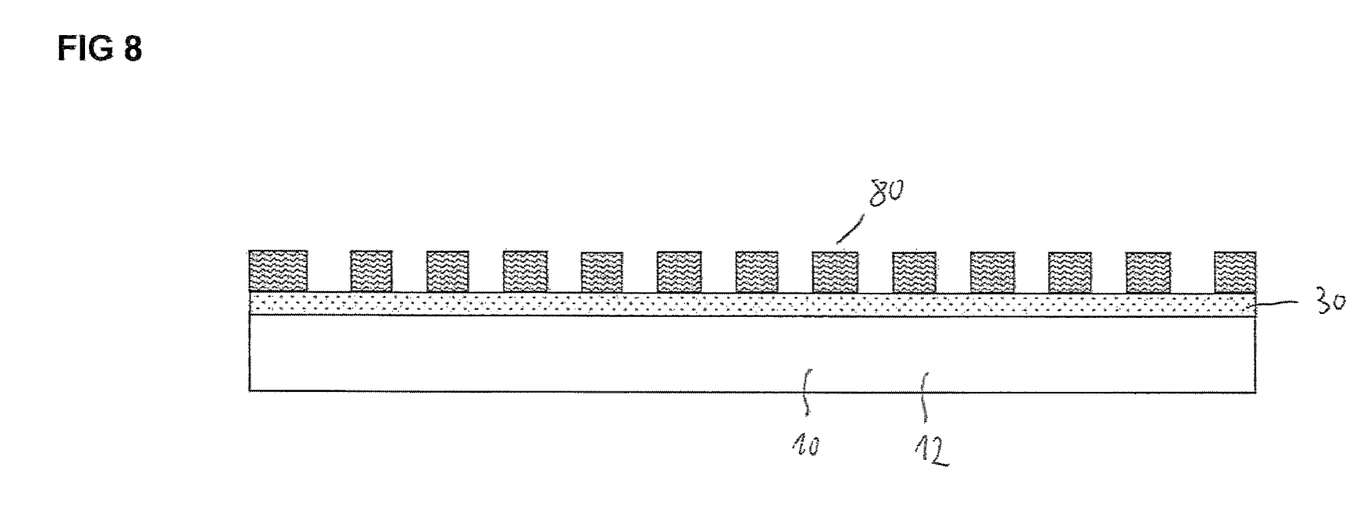
FIG. 8 shows a configuration of a color reaction layer with a full-surface course of a color reaction layer and a grid-like overprint of an opaque ink.

FIG. 8 shows a further configuration of the foil structure 1, in which the color reaction layer 30 is overprinted in full-surface manner on the carrier foil 10. An opaque ink 80 is overprinted in grid printing on the course of the color reaction layer 30 printed in full-surface manner. In such an embodiment, a homogenization of the light emitted by the LED chip 20 may be achieved, for example, by overprinting the opaque ink in full-surface manner above the light output face of the LED chip or with small spacing between the dots and/or lines of the grid on the color reaction layer 30 and by increasing the dot and/or line spacing of the opaque ink 80 with increasing spacing from the light output face of the LED chip toward the rim of the color reaction layer 30.

In order to create, within the color reaction layer 30, a specific pattern that lights up during irradiation from the back side with the light emitted by the LED chip, the pattern may be printed directly, for example, with a phosphor ink in the color reaction layer 30. Those places that are not supposed to light up may be printed with an opaque ink.

In order to influence and possibly to homogenize the light scattering and light intensity, it is possible to apply various printing methods. For example, the color reaction layer 30 may be overprinted on the carrier foil 10 or the carrier/cover foil 60 in grid printing in the form of dots and/or lines, wherein the color reaction layer 30 is provided with phosphor inks having various opacities.

According to a further embodiment, the profile shape of the grid may be changed. Starting from round profiles, the shape of the grid dots may be changed into concentric circles and, for example transformed into square dots. Depending on change of the profile shape, it is therefore possible to achieve an intensity equalization of the light emitted by the LED chip within the color reaction layer 30 from the inside, meaning above the light output face of the LED chip, to the outside, meaning toward the rims of the color reaction layer, which are situated further removed from the light output face of the LED chip.

A further possibility for creation of an intensity equalization of the emitted light or for homogenization of the emitted light consists in varying the phosphor proportion in the color reaction layer 30. For example, those regions of the color reaction layer 30 that are disposed directly above the light output face 21 of the LED chip 20 are provided with a smaller phosphor proportion than those regions of the color reaction layer 30 that, at the rims of the color reaction layer 30, are situated further removed from the light output face 21 of the LED chip.

A further possibility for changing the intensity of the emitted light consists in overprinting a further ink layer as a "damping ink" above the color reaction layer 30. In such a case, it is possible, for example, to apply the color reaction layer 30 in full-surface manner first on the portion 12 of the carrier foil 10 or on the carrier/cover foil 60. Then a further ink layer is overprinted as a "damping ink" in grid printing above the color reaction layer 30. In order to damp the light emerging with high intensity directly above the light output face of the LED chip, the further ink layer may be applied or overprinted in full-surface manner or with narrow grid spacing on the portions of the color reaction layer 30 that in projection are disposed perpendicularly above the light output face of the LED chip. The grid spacing with which the further ink layer is applied above the color reaction layer then increases from inside to outside toward the rims of the color reaction layer. In this embodiment, the damping ink acts as a color filter, so that light emitted by the LED can be changed in its intensity.

To achieve higher resolutions of the dot or line grid, the possibility exists of reprocessing, by means of a laser, the ink, overprinted in grid printing, of the color reaction Layer 30, an opaque ink, a "damping ink" or a further ink layer.

Figure 9:
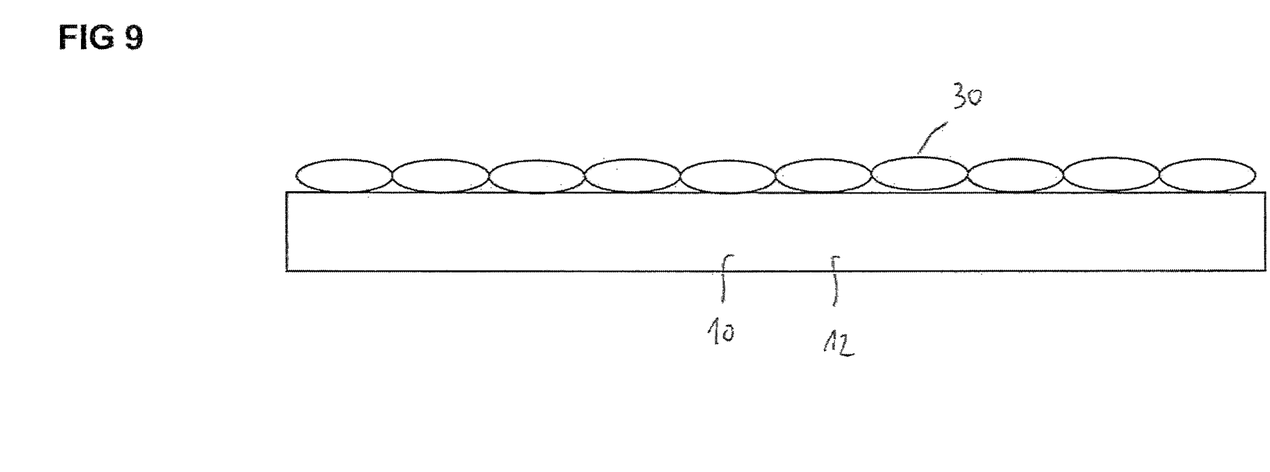
FIG. 9 shows a configuration of a color reaction layer in the form of lens-like particles.

According to a further configuration of the foil structure, the individual grid dots of the color reaction layer 30 may be configured as lens-shaped ink droplets. The ink droplets therefore act as "micro lenses" and change the light emitted by the LED chip. For illustration of this configuration, FIG. 9 shows, for example, the portion 12 of the carrier foil 10 with the color reaction layer 30 disposed above it in the form of lens-shaped droplets. As an example, the lens-shaped ink droplets may be printed in the inkjet process. The lens shape and size may be adjustable by variable surface tension of the coloring agent or ink. The layer thickness of the color reaction layer 30 or the grid spacing may be varied by changing the size and the number of the ink droplets by means of the inkjet process.

Figure 10:
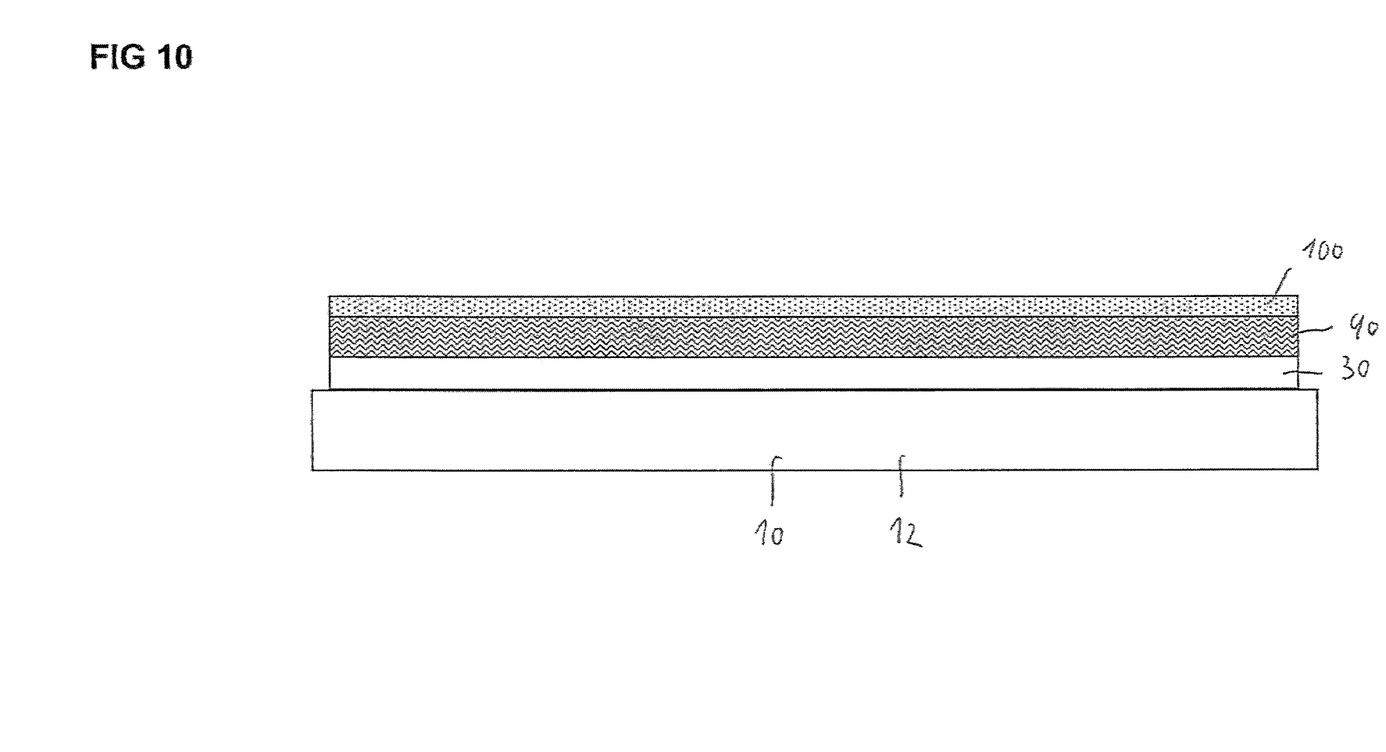
FIG. 10 shows a configuration of a color reaction layer with a UV-light-blocking layer.

FIG. 10 shows an embodiment of the foil structure 1 in a partial view with the portion 12 of the carrier foil 10, on which the color reaction layer 30 is applied. A UV-light-blocking layer 90 and optionally an additional ink layer 100 of a visible ink is disposed above the color reaction layer 30. The UV-light-blocking layer prevents a pattern, for example, which is integrated in the color reaction layer 30, from already being visible to an observer when the color reaction layer 30 is being irradiated not by the light of the LED chip but only by the ambient light. In ambient light, the observer instead sees only the ink layer 100 comprising the visible ink and disposed above the UV-light-blocking layer 90. In the case of a white ink layer 100, the observer therefore sees only a white ink area before the switching-on of the LED. It is only during backlighting of the color reaction layer 30 with the light emitted by the LED chip that a pattern becomes visible within the color reaction layer 30.

According to a further embodiment, the possibility exists of the establishment of a partial shadowing—which can be electrically actuated—in order to be able to display more than one symbol at one place within the color reaction layer 30.

In the following, "mechanical" options for light guiding or light scattering will be presented.

Figure 11:
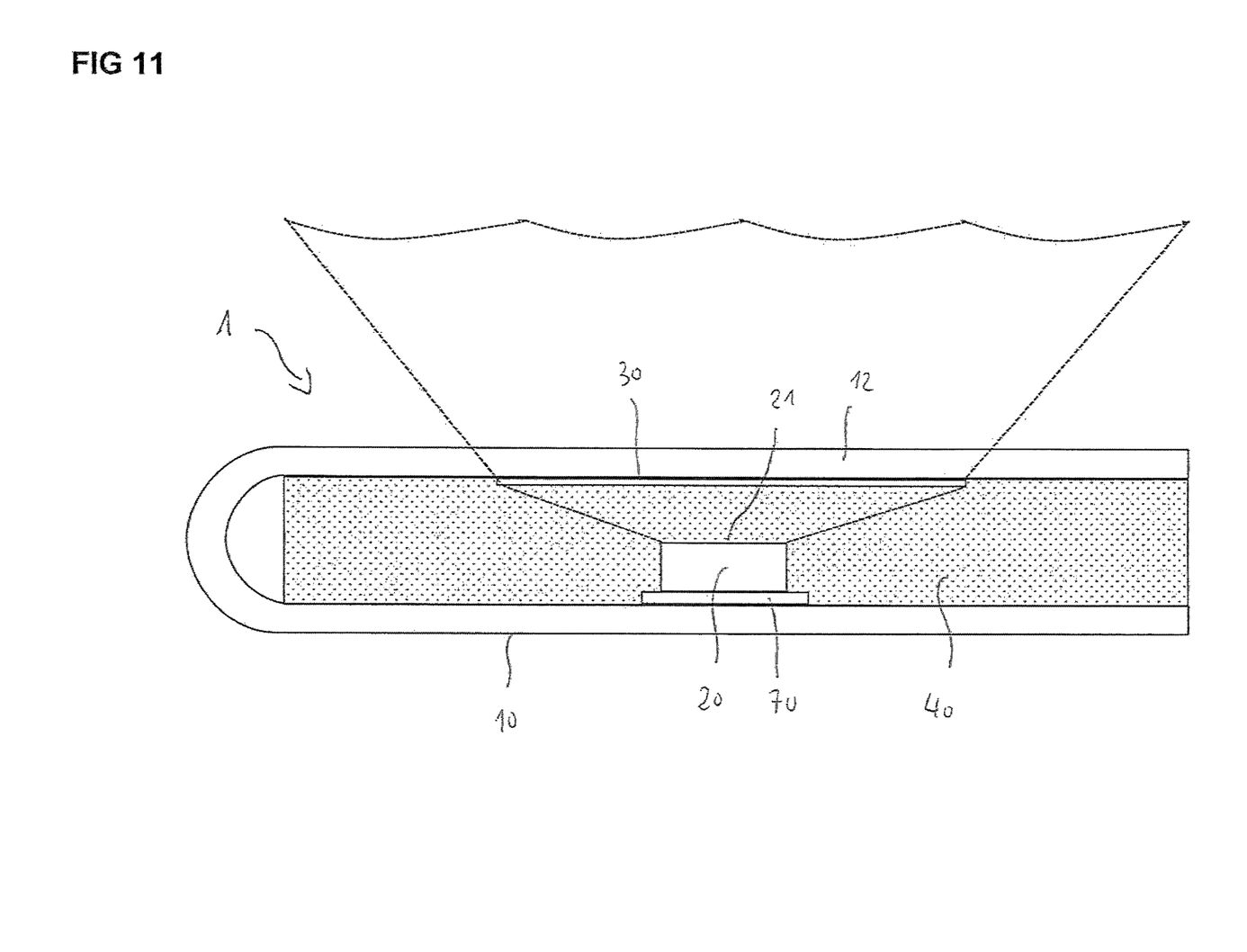
FIG. 11 shows a further embodiment of a foil structure with generation of visible light by means of LED technology with a spacing layer between a light output face of an LED chip and a color reaction layer.

FIG. 11 shows an embodiment of the foil structure 1, in which a spacing layer 40 is disposed between the the light output face 21 of the LED chip 20 and the color reaction layer 30, in order to influence the spacing between the light output face 21 and the color reaction layer 30. As in the embodiment of the foil structure with edge emitter shown in FIGS. 3 and 4, the spacing layer 40 may also be disposed between the portion 13 of the carrier foil 10 and the portion 12 of the carrier foil 10 or between the portion 13 of the carrier foil 10 and the carrier/cover foil 60.

The spacing layer 40 may be formed as a printed light guide. According to a further embodiment, the spacing layer 40 may be formed as a light-guiding foil with or without prisms, as a light-guiding foil with scattering effects or as a light-guiding, matted foil ("milk glass foil"). The optical properties of the spacing foil 40 may be influenced by means of a laser. For example, a digital, position-dependent matting of the foil may be produced in this way. Furthermore, the possibility exists of impressing patterns, for example 3D patterns, in the spacing foil.

Figure 12:
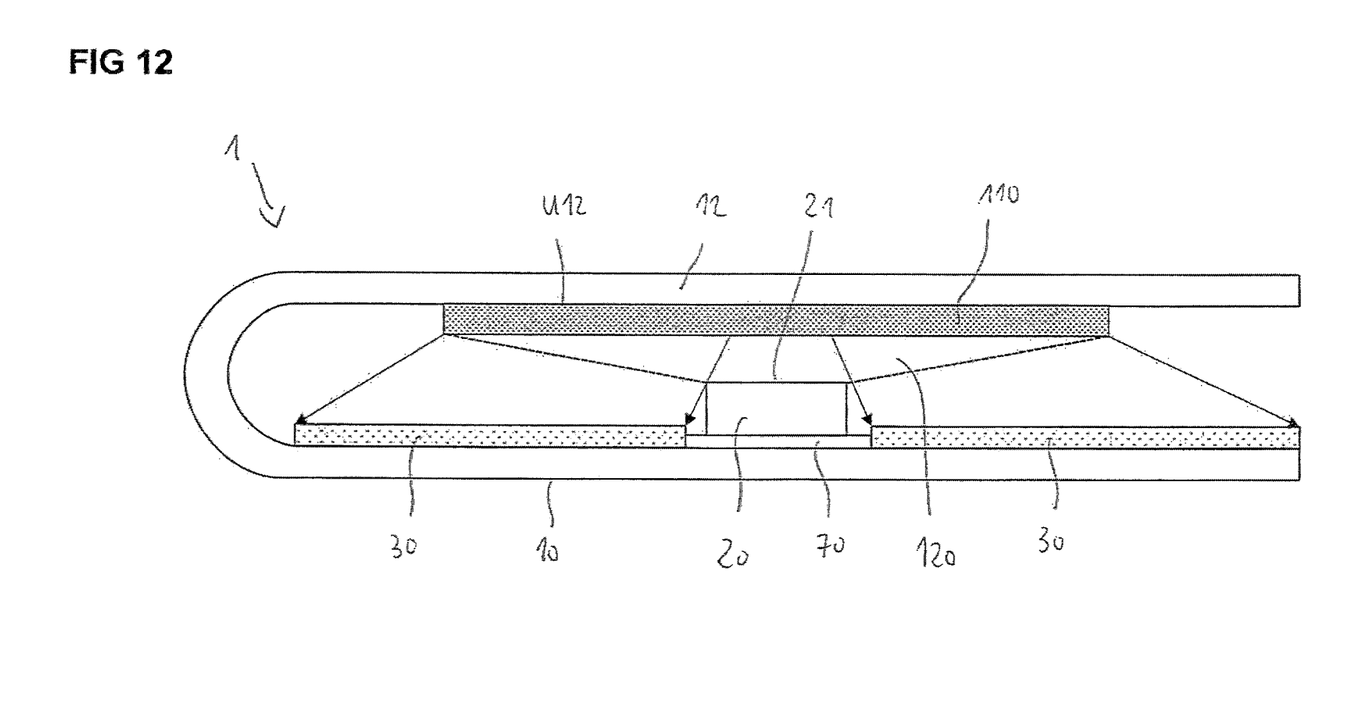
FIG. 12 shows a further embodiment of a foil structure with generation of visible light by means of LED technology with a reflector layer for reflection of the UV light emitted by an LED chip.

FIG. 12 shows an embodiment of the foil structure 1 on the example of the foil structure with folded-over carrier foil. Instead of this arrangement, the foil structure may also be provided with a separate carrier/cover foil 60. The LED chip 20 emits light in the direction of the portion 12 of the carrier foil 10 or in the direction of the carrier/cover foil 60. Depending on embodiment, the underside U12 of the portion 12 of the carrier foil 10 or the underside U60 of the carrier/cover foil 60 is coated with a reflector layer 110. The color reaction layer 30 is disposed on the carrier foil 10 alongside the LED chip 20. The reflector layer 110 is formed for the purpose of scattering the UV light of the LED chip reflected at the reflector layer 110 in the direction of the color reaction layer 30. The reflector layer 110 may be formed, for example, as an aluminum foil or as a layer of glass spheres. Due to such a configuration of the foil structure, a larger scattering width of the LED chip is achieved and the light yield can be improved.

What is claimed is:

1. A foil structure generating visible light using LED technology, the foil structure comprising:
   (a) a carrier foil having a first portion and a second portion, the carrier foil being folded over so that the second portion of the carrier foil is disposed above the first portion of the carrier foil;
   (b) an LED chip for generation of UV light disposed on the first portion of the carrier foil and comprising a light output face for emission of the UV light;
   (c) a color reaction layer for conversion of the UV light into the visible light; and
   (d) a spacing layer;
   wherein the spacing layer is arranged laterally offset relative to the LED chip such that a bottom surface of the spacing layer is disposed on the first portion of the carrier foil and a top surface of the spacing layer is disposed on the second portion of the carrier foil, or wherein the spacing layer is arranged between the light output face of the LED chip and the color reaction layer such that the bottom surface of the spacing layer is disposed on the light output face of the LED chip and the top surface of the spacing layer is disposed on the second portion of the carrier foil;
   wherein the color reaction layer is disposed above the LED chip or laterally offset relative to the LED chip; and
   wherein the color reaction layer comprises a structuring so that the UV light emitted from the light output face of the LED chip is not emitted into the surrounding of the foil structure.

2. The foil structure according to claim 1, wherein the color reaction layer is provided with at least one course formed as at least one of a dot, a line grid of dots, and lines of the color reaction layer.

3. The foil structure according to claim 2, wherein the at least one course of the color reaction layer has dots or lines of various heights or various relative spacing of the dots or lines or both.

4. The foil structure according to claim 1, wherein the LED chip is formed as an edge emitter; and wherein the edge emitter beams the UV light emitted from the light output face into the spacing layer.

5. The foil structure according to claim 1, wherein the spacing layer is formed as a light-guiding foil with prisms or as a light-guiding foil with scattering effects or as a light-guiding matted foil.

6. The foil structure according to claim 1, wherein the at least one course of the color reaction layer is provided with phosphor inks having various opacities.

7. The foil structure according to claim 1, wherein the color reaction layer is provided with at least one further course disposed in a full-surface manner on the carrier foil or on a further carrier foil; and wherein the at least one course of the color reaction layer is disposed on the at least one further course of the color reaction layer.

8. The foil structure according to claim 1, wherein an opaque ink layer is disposed in regions between the dots, the lines of the dot, or the line grid of the at least one course of the color reaction layer.

9. The foil structure according to claim 1, wherein the color reaction layer is disposed in a full-surface manner on the carrier foil or on a further carrier foil; and wherein at least one of a dot, a line grid of dots, and lines of an opaque ink is disposed above the color reaction layer.

10. The foil structure according to claim 1, wherein the color reaction layer contains phosphor in various phosphor proportions in a position-dependent manner.

11. The foil structure according to claim 1, further comprising at least one of a UV-light-blocking layer and an ink layer of a visible ink disposed above the color reaction layer.

12. The foil structure according to claim 1, wherein the color reaction layer is provided with lens-shaped ink droplets.

13. A foil structure generating visible light using LED technology, the foil structure comprising:
(a) a carrier foil;
(b) a further carrier foil;
(c) an LED chip for generation of UV light disposed on the carrier foil and comprising a light output face for emission of the UV light;
(d) a color reaction layer for conversion of the UV light into the visible light;
and
(e) a spacing layer;
wherein the further carrier foil is disposed above the carrier foil with the LED chip;
wherein the color reaction layer is disposed above the LED chip or laterally offset relative to the LED chip;
wherein the color reaction layer comprises a structuring so that the UV light emitted from the light output face of the LED chip is not emitted into the surrounding of the foil structure;
wherein the spacing layer is arranged laterally offset relative to the LED chip such that a bottom surface of the spacing layer is disposed on the carrier foil with the LED chip and a top surface of the spacing layer is disposed on the further carrier foil, or wherein the spacing layer is arranged between the light output face of the LED chip and the color reaction layer such that the bottom surface of the spacing layer is disposed on the light output face of the LED chip and the top surface of the spacing layer is disposed on the further carrier foil.

14. The foil structure according to claim 13,
wherein the LED chip is formed as an edge emitter; and
wherein the edge emitter beams the UV light emitted from the light output face into the spacing layer.

15. The foil structure according to claim 13,
wherein the at least one course of the color reaction layer is provided with phosphor inks having various opacities.

16. The foil structure according to claim 13,
wherein the color reaction layer is provided with at least one course formed as at least one of a dot, a line grid of dots, and lines of the color reaction layer;
wherein the color reaction layer is provided with at least one further course disposed in a full-surface manner on the carrier foil or on a further carrier foil; and
wherein the at least one course of the color reaction layer is disposed on the at least one further course of the color reaction layer.

17. The foil structure according to claim 13,
wherein the color reaction layer contains phosphor in various phosphor proportions in a position-dependent manner.

18. The foil structure according to claim 13, further comprising:
at least one of a UV-light-blocking layer and an ink layer of a visible ink disposed above the color reaction layer.

19. The foil structure according to claim 13,
wherein the color reaction layer is provided with lens-shaped ink droplets.

20. The foil structure according to claim 13,
wherein the spacing layer is formed as a light-guiding foil with prisms or as a light-guiding foil with scattering effects or as a light-guiding matted foil.

* * * * *

UNITED STATES PATENT AND TRADEMARK OFFICE
CERTIFICATE OF CORRECTION

PATENT NO. : 10,760,771 B2
APPLICATION NO. : 16/010669
DATED : September 1, 2020
INVENTOR(S) : Becker et al.

Page 1 of 1

It is certified that error appears in the above-identified patent and that said Letters Patent is hereby corrected as shown below:

On the Title Page

Column 1, item (72), please change "Illmmuenster (DE)" to correctly read:
--Ilmmuenster (DE)--.

Signed and Sealed this
Twentieth Day of October, 2020

Andrei Iancu
*Director of the United States Patent and Trademark Office*